US011398186B2

(12) United States Patent
Toyomura

(10) Patent No.: US 11,398,186 B2
(45) Date of Patent: Jul. 26, 2022

(54) PIXEL CIRCUIT, DISPLAY DEVICE, DRIVING METHOD OF PIXEL CIRCUIT, AND ELECTRONIC APPARATUS

(71) Applicant: SONY SEMICONDUCTOR SOLUTIONS CORPORATION, Kanagawa (JP)

(72) Inventor: Naobumi Toyomura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/967,559

(22) PCT Filed: Jan. 25, 2019

(86) PCT No.: PCT/JP2019/002460
§ 371 (c)(1),
(2) Date: Aug. 5, 2020

(87) PCT Pub. No.: WO2019/159651
PCT Pub. Date: Aug. 22, 2019

(65) Prior Publication Data
US 2021/0233468 A1   Jul. 29, 2021

(30) Foreign Application Priority Data
Feb. 14, 2018   (JP) .............................. JP2018-024112

(51) Int. Cl.
*G09G 3/3233*   (2016.01)
(52) U.S. Cl.
CPC ... *G09G 3/3233* (2013.01); *G09G 2300/0819* (2013.01); *G09G 2300/0842* (2013.01);
(Continued)

(58) Field of Classification Search
None
See application file for complete search history.

(56) References Cited

U.S. PATENT DOCUMENTS 10,636,354 B2 *   4/2020   Toyomura ............ G09G 3/3258
2008/0100543 A1 *   5/2008   Kasai .................... G09G 3/3291
345/77
(Continued)

FOREIGN PATENT DOCUMENTS

CN   101221726 A   7/2008
CN   103390386 A   11/2013
(Continued)

OTHER PUBLICATIONS

International Search Report and Written Opinion of PCT Application No. PCT/JP2019/002460, dated Apr. 16, 2019, 08 pages of ISRWO.

*Primary Examiner* — Dorothy Harris
(74) *Attorney, Agent, or Firm* — Chip Law Group

(57) ABSTRACT

A pixel circuit is provided including a light-emitting element, a drive transistor that supplies a current to the light-emitting element, a light-emission control transistor that controls connection between a drain node of the drive transistor and an anode of the light-emitting element, and a first reset transistor that sets a potential of the anode of the light-emitting element to a predetermined potential. The pixel circuit further includes a second reset transistor that controls connection between a drain node of the drive transistor and a gate node of the drive transistor, a write transistor that controls writing of a signal voltage at the gate node of the drive transistor, and a capacitive element provided between a signal line to which the signal voltage is applied and a source node of the write transistor.

6 Claims, 6 Drawing Sheets

(52) U.S. Cl.
CPC . *G09G 2300/0861* (2013.01); *G09G 2310/08* (2013.01); *G09G 2320/0252* (2013.01); *G09G 2320/045* (2013.01)

(56) References Cited

U.S. PATENT DOCUMENTS

| | | | |
|---|---|---|---|
| 2008/0170011 A1 | 7/2008 | Kohno et al. | |
| 2010/0013816 A1* | 1/2010 | Kwak | G09G 3/3233 345/211 |
| 2012/0026145 A1* | 2/2012 | Jeong | G09G 3/3233 345/211 |
| 2013/0300724 A1* | 11/2013 | Chaji | G09G 3/3283 345/212 |
| 2014/0139412 A1* | 5/2014 | Han | G09G 3/3233 345/82 |
| 2015/0356921 A1* | 12/2015 | Lee | G09G 3/3266 345/82 |
| 2016/0042692 A1 | 2/2016 | Ota et al. | |

FOREIGN PATENT DOCUMENTS

| | | |
|---|---|---|
| CN | 106205470 A | 12/2016 |
| EP | 2662852 A2 | 11/2013 |
| JP | 2008-170788 A | 7/2008 |
| JP | 2015-034861 A | 2/2015 |
| JP | 2016-038425 A | 3/2016 |
| KR | 10-2015-0142143 A | 12/2015 |
| TW | 201607023 A | 2/2016 |

\* cited by examiner

PRIOR ART

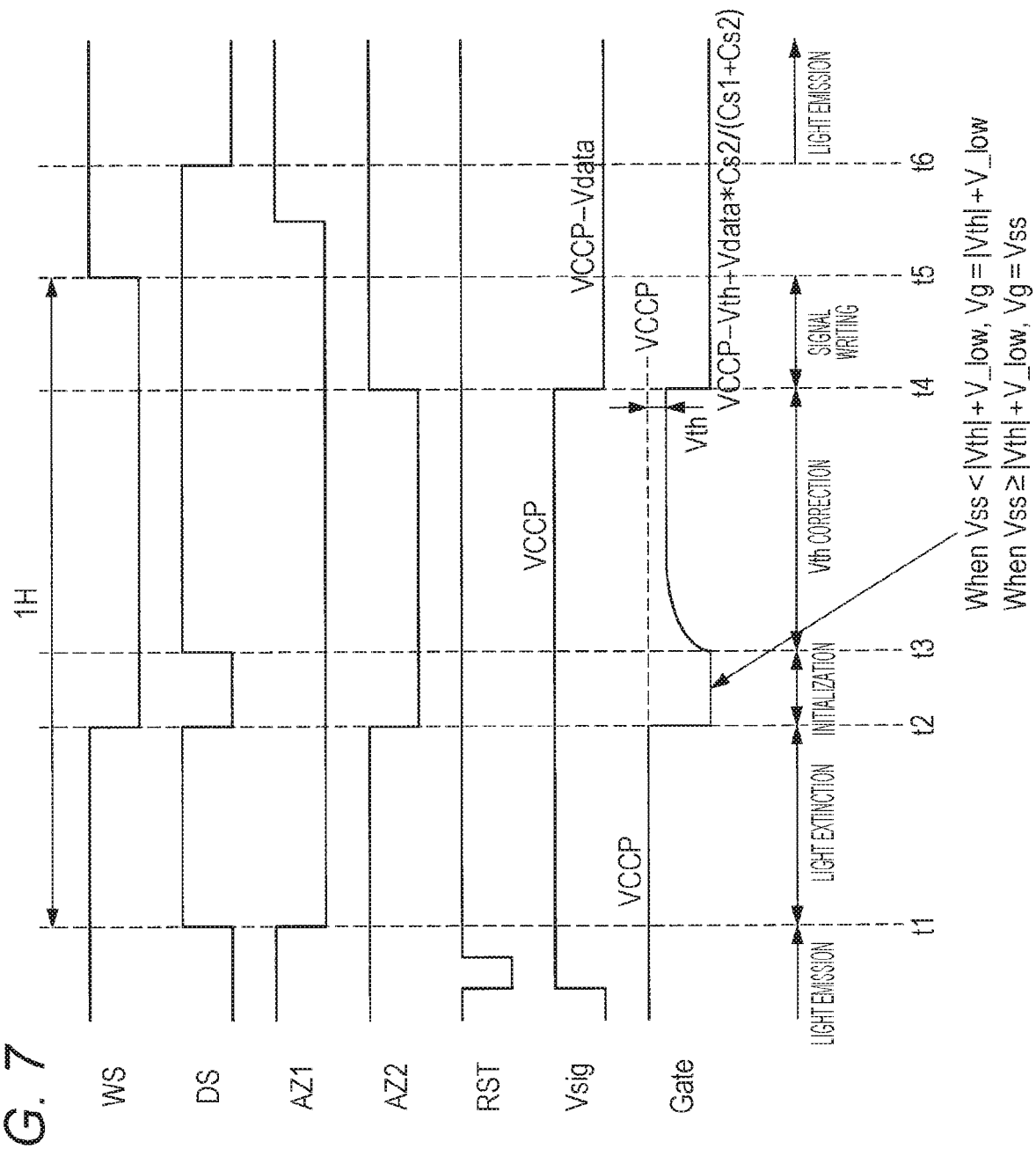

PIXEL CIRCUIT, DISPLAY DEVICE, DRIVING METHOD OF PIXEL CIRCUIT, AND ELECTRONIC APPARATUS

CROSS REFERENCE TO RELATED APPLICATIONS

This application is a U.S. National Phase of International Patent Application No. PCT/JP2019/002460 filed on Jan. 25, 2019, which claims priority benefit of Japanese Patent Application No. JP 2018-024112 filed in the Japan Patent Office on Feb. 14, 2018. Each of the above-referenced applications is hereby incorporated herein by reference in its entirety.

TECHNICAL FIELD

The present disclosure relates to a pixel circuit, a display device, a driving method of the pixel circuit, and an electronic apparatus.

BACKGROUND ART

In recent years, in the field of display devices, a flat (flat-panel) display device in which pixels including light-emitting units are arranged in rows and columns (a matrix) has become the mainstream. One example of the flat display devices is an organic electroluminescence (EL) display device using a so-called current-driven electro-optical element such as an organic EL element whose emission luminance changes according to the value of a current flowing through a light-emitting unit.

In a flat display device a typical example of which is this organic EL display device, transistor characteristics (for example, a threshold voltage) of a drive transistor that drives an electro-optical element varies from pixel to pixel due to process variations or the like in some cases. For example, Patent Document 1 discloses a technology of a display device capable of shortening a writing time of an initialization voltage to a gate node of a drive transistor in performing correction operation of characteristics of the drive transistor.

CITATION LIST

Patent Document

Patent Document 1: Japanese Patent Application Laid-Open No. 2015-34861

SUMMARY OF THE INVENTION

Problems to be Solved by the Invention

Reducing the time required for correcting a threshold voltage of a drive transistor leads to speeding up driving of a pixel circuit. However, if the number of transistors in one pixel is increased in order to reduce the time required for correcting the threshold voltage of the drive transistor, the size of the pixel circuit increases.

Therefore, in the present disclosure, a new and improved pixel circuit, display device, driving method of the pixel circuit, and electronic apparatus are proposed capable of shortening time required for correcting a threshold voltage of a drive transistor and speeding up driving of the pixel circuit without increasing the size of the pixel circuit.

Solutions to Problems

According to the present disclosure, there is provided a pixel circuit including a light-emitting element, a drive transistor configured to supply a current to the light-emitting element, a light-emission control transistor configured to control connection between a drain node of the drive transistor and an anode of the light-emitting element, a first reset transistor configured to set a potential of the anode of the light-emitting element to a predetermined potential, a second reset transistor configured to control connection between the drain node of the drive transistor and a gate node of the drive transistor, a write transistor configured to control writing of a signal voltage at a gate node of the drive transistor, and a capacitive element provided between a signal line to which the signal voltage is applied and a source node of the write transistor.

Furthermore, according to the present disclosure, there is provided a driving method of a pixel circuit including a light-emitting element, a drive transistor configured to supply a current to the light-emitting element, a light-emission control transistor configured to control connection between a drain node of the drive transistor and an anode of the light-emitting element, a first reset transistor configured to set a potential of the anode of the light-emitting element to a predetermined potential, a second reset transistor configured to control connection between the drain node of the drive transistor and a gate node of the drive transistor, a write transistor configured to control writing of a signal voltage at the gate node of the drive transistor, a first capacitive element provided between the gate node of the drive transistor and a power supply line, and a second capacitive element provided between a signal line to which the signal voltage is applied and a source node of the write transistor, the method including turning off the light-emission control transistor and turning on the first reset transistor to set the potential of the anode of the light-emitting element to the predetermined potential upon start of a first period, turning on the write transistor and the light-emission control transistor and turning on the second reset transistor to set a potential of the gate node of the drive transistor to a preparation voltage upon start of a second period after the first period, turning off the light-emission control transistor to correct a threshold voltage of the drive transistor upon start of a third period after the second period, turning on the second reset transistor upon start of a fourth period after the third period, turning off the write transistor upon start of a fifth period after the fourth period, turning off the first reset transistor during the fifth period, and turning on the light-emission control transistor to supply a current to the light-emitting element upon start of a sixth period after the fifth period.

Effects of the Invention

As described above, according to the present disclosure, it is possible to provide a new and improved pixel circuit, display device, driving method of the pixel circuit, and electronic apparatus capable of shortening time required for correcting a threshold voltage of a drive transistor and speeding up driving of the pixel circuit without increasing the size of the pixel circuit.

Note that the effects described above are not necessarily limited, and along with or in lieu of the effects described above, any of the effects described in the present Description, or another effect that can be grasped from the present Description may be exhibited.

BRIEF DESCRIPTION OF DRAWINGS

FIG. 7 is an explanatory diagram illustrating an example of driving of the pixel circuit illustrated in FIG. 6.

MODE FOR CARRYING OUT THE INVENTION

Figure 1:
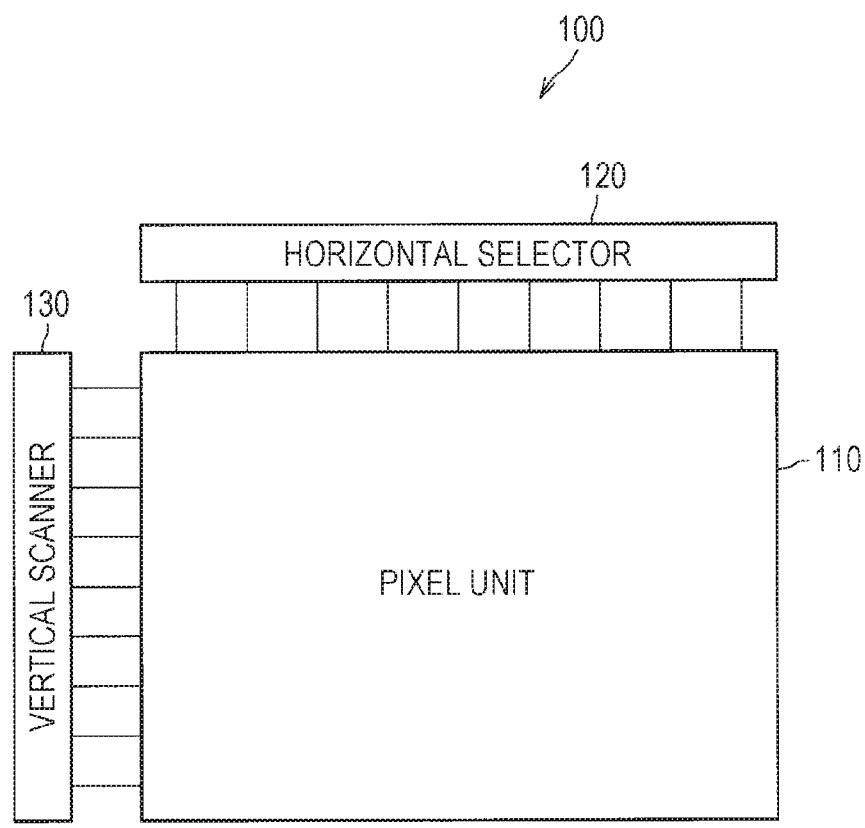
FIG. 1 is an explanatory diagram illustrating a configuration example of a display device 100 according to an embodiment of the present disclosure.

Hereinafter, a preferred embodiment of the present disclosure will be described in detail with reference to the accompanying drawings. Note that in the present Description and the drawings, the same reference signs denote constituents having substantially the same functional configuration and an overlapping description will be omitted.

Note that the description will be given in the following order.
1. Embodiments of Present Disclosure
1.1. Description in General of Display Device, Driving Method of Display Device, and Electronic Apparatus of Present Disclosure
1.2. Configuration Example and Operation Example
2. Summary 1. Embodiments of Present Disclosure 1.1. Description in General of Display Device, Driving Method of Display Device, and Electronic Apparatus of Present Disclosure A display device according to the present disclosure is a flat (flat-panel) display device in which a pixel circuit is arranged, the pixel circuit having a sampling transistor and a holding capacitance in addition to a drive transistor that drives a light-emitting unit. Examples of the flat display device include an organic EL display device, a liquid crystal display device, a plasma display device, and the like. Among these display devices, in the organic EL display device, an organic EL element is used as a light-emitting element (electro-optical element) of a pixel. In the organic EL element, electroluminescence of organic material is used to utilize a phenomenon of emitting light when an electric field is applied to an organic thin film.

An organic EL display device in which an organic EL element is used as a light-emitting unit of a pixel has the following advantages. That is, since the organic EL element can be driven by an applied voltage of 10 V or less, the organic EL display device consumes lower power. Since the organic EL element is a self-luminous element, the organic EL display device has higher image visibility than a liquid crystal display device, which is also an example of the flat display device. Furthermore, since the organic EL display device does not require a lighting member such as a backlight, the weight and the thickness of the organic EL display device can be easily reduced. Moreover, since the response speed of the organic EL element is as high as several microseconds, the organic EL display device does not generate an afterimage when a moving image is displayed.

The organic EL element is a self-luminous element and is also a current-driven electro-optical element. Examples of the current-driven electro-optical element include an inorganic EL element, an LED element, a semiconductor laser element, and the like, in addition to an organic EL element.

A flat display device such as an organic EL display device can be used as a display unit (display device) in each of various electronic apparatuses including the display unit. Examples of the various electronic apparatuses include, in addition to a television system, a head-mounted display, a digital camera, a video camera, a game console, a laptop personal computer, a portable information apparatus such as an electronic book, a mobile communication apparatus such as a personal digital assistant (PDA) or a mobile phone, and the like.

In the display device, the driving method of the display device, and the electronic apparatus according to the present disclosure, a drive unit may be configured to set a gate node of the drive transistor to a floating state and then set a source node to a floating state. Furthermore, the drive unit may be configured to cause the sampling transistor to write a signal voltage while the source node of the drive transistor is kept to be a floating state. A configuration may be adopted where an initialization voltage is supplied to a signal line at a timing different from that of the signal voltage, and is written from the signal line to the gate node of the drive transistor by sampling performed by the sampling transistor.

In the display device, the driving method of the display device, and the electronic apparatus according to the present disclosure including the above-described preferable configuration, a configuration may be adopted where the pixel circuit is formed on a semiconductor such as silicon. Furthermore, the drive transistor may include a P-channel transistor. The reason for using a P-channel transistor instead of an N-channel transistor as the drive transistor is as follows.

In a case where a transistor is formed on a semiconductor such as silicon instead of an insulator such as a glass substrate, the transistor does not have three terminals of source/gate/drain, but has four terminals of source/gate/drain/back gate (base). Then, in a case where an N-channel transistor is used as the drive transistor, a back-gate (substrate) voltage is 0 V, which adversely affects operation of correcting variation in threshold voltages of the drive transistor for each pixel, and the like.

Furthermore, variation in characteristics of a transistor is smaller in a P-channel transistor without a lightly doped drain (LDD) region than in an N-channel transistor having an LDD region, which is advantageous in achieving miniaturization of a pixel and in turn, higher definition of the display device. For such a reason and the like, in a case where formation on a semiconductor such as silicon is assumed, it is preferable to use a P-channel transistor instead of an N-channel transistor as the drive transistor.

In the display device, the driving method of the display device, and the electronic apparatus according to the present disclosure including the above-described preferable configuration, also the sampling transistor may include a P-channel transistor.

Alternatively, in the display device, the driving method of the display device, and the electronic apparatus of the present disclosure including the above-described preferable configuration, the pixel circuit may include a light-emission control transistor that controls light emission/non-light emission of the light-emitting unit. At this time, also the light-emission control transistor may include a P-channel transistor.

Alternatively, in the display device, the driving method of the display device, and the electronic apparatus of the present disclosure including the above-described preferable configuration, the holding capacitance may be connected between the gate node and the source node of the drive transistor. Furthermore, the pixel circuit may include an auxiliary capacitance connected between the source node of the drive transistor and a node of a fixed potential.

Alternatively, in the display device, the driving method of the display device, and the electronic apparatus of the present disclosure including the above-described preferable configuration, the pixel circuit may include a switching transistor connected between a drain node of the drive transistor and a cathode node of the light-emitting unit. At this time, also the switching transistor may include a P-channel transistor. Furthermore, the drive unit may be configured to make the switching transistor conductive during a non-light emitting period of the light-emitting unit.

Alternatively, in the display device, the driving method of the display device, and the electronic apparatus according to the present disclosure including the above-described preferable configuration, the drive unit may be configured to set a signal for driving the switching transistor to an active state before a sampling timing of the initialization voltage by the sampling transistor. Then, the drive unit may set a signal for driving the light-emission control transistor to an active state and thereafter to an inactive state. At this time, the drive unit may be configured to cause the sampling transistor to complete sampling of the initialization voltage before the signal for driving the light-emission control transistor is set to the inactive state.

1.2. Configuration Example and Operation Example

Subsequently, a configuration example of the display device according to an embodiment of the present disclosure will be described. FIG. 1 is an explanatory diagram illustrating a configuration example of a display device 100 according to an embodiment of the present disclosure. Hereinafter, a configuration example of the display device 100 according to the embodiment of the present disclosure will be described with reference to FIG. 1.

A pixel unit 110 has a configuration where pixels each provided with a self-luminous element such as organic EL elements or the like are arranged in a matrix. In the pixel unit 110, for the pixels arranged in a matrix, scanning lines are provided in a horizontal direction in units of lines, and a signal line is provided for each column so as to be orthogonal to the scanning lines.

A horizontal selector 120 sequentially transfers a predetermined sampling pulse and sequentially latches image data with the sampling pulse, and thus distributes the image data to each signal line. Furthermore, the horizontal selector 120 performs an analog-to-digital conversion process on the image data distributed to each signal line, and thus generates a drive signal representing the emission luminance of each pixel connected to each signal line by time division. The horizontal selector 120 outputs this drive signal to a corresponding signal line.

A vertical scanner 130 generates a drive signal for each pixel in response to driving of the signal line by the horizontal selector 120, and outputs the drive signal to a scanning line SCN. As a result, the display device 100 causes the vertical scanner 130 to sequentially drive each pixel arranged in the pixel unit 110, causes each pixel to emit light at the signal level of each signal line set by the horizontal selector 120, and displays a desired image on the pixel unit 110.

Figure 2:
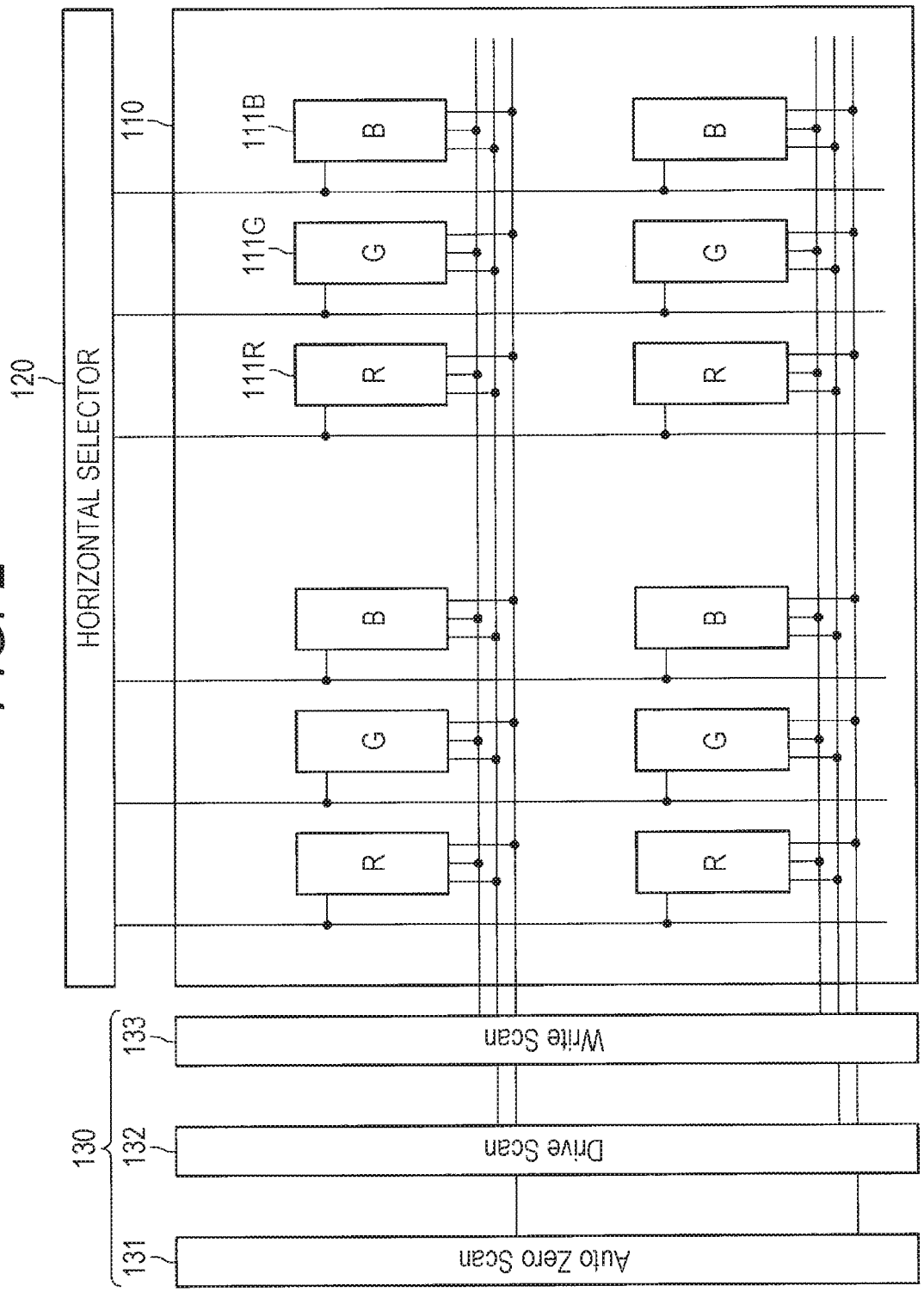
FIG. 2 is an explanatory diagram illustrating a more detailed configuration example of the display device 100 according to the embodiment.

FIG. 2 is an explanatory diagram illustrating a more detailed configuration example of the display device 100 according to the embodiment of the present disclosure. Hereinafter, a configuration example of the display device 100 according to the embodiment of the present disclosure will be described with reference to FIG. 2.

In the pixel unit 110, pixels 111R that display red, pixels 111G that display green, and pixels 111B that display blue are arranged in a matrix.

Then, the vertical scanner 130 includes an auto zero scanner 131, a drive scanner 132, and a write scanner 133. By supplying signals from the respective scanners to the pixels arranged in a matrix in the pixel unit 110, TFTs provided in the respective pixels are turned on and off.

Various forms of the respective pixels provided in the pixel unit 110 are conceivable; however, a case where five P-channel MOS transistors are provided will be described below. Subsequently, a detailed circuit configuration example of each pixel provided in the pixel unit 110 will be described. Before the pixel circuit according to the present embodiment is described in detail, configuration examples of a pixel circuit serving as comparative examples will be described.

Figure 3:
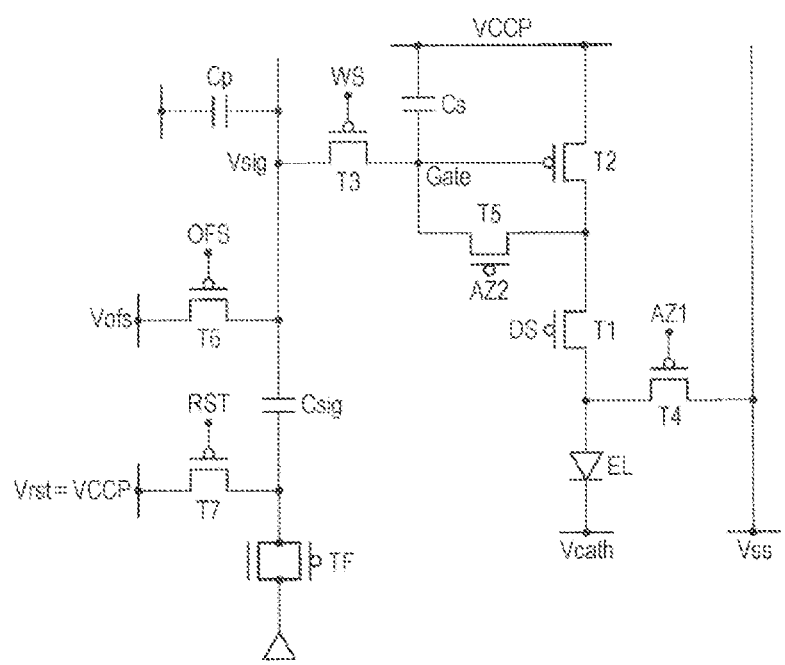
FIG. 3 is an explanatory diagram illustrating a configuration example of a pixel circuit serving as a comparative example.

FIG. 3 is an explanatory diagram illustrating a configuration example of the pixel circuit serving as a comparative example. The pixel circuit illustrated in FIG. 3 includes P-channel transistors T1 to T5, an organic EL element EL, and a capacitive element Cs. Furthermore, a signal line that supplies a video signal Vsig to the pixel circuit includes a capacitive element Csig and a transfer gate TF. Furthermore, in FIG. 3, a signal-line parasitic capacitance Cp with respect to the signal line that supplies the video signal Vsig is illustrated.

The transistor T1 functions as a light-emission control transistor, has a gate connected to a signal line DS, the drain connected to an anode of the organic EL element EL, and a source connected to a drain of the transistor T2. A video signal Vsig is supplied to the gate of the transistor T2 via the transistor T3, and the source of the transistor T2 is connected to a power supply voltage VCCP. The gate of the transistor T3 is connected to a signal line WS. The gate of the transistor T4 is connected to a signal line AZ1. The gate of the transistor T5 is connected to a signal line AZ2.

Furthermore, FIG. 3 illustrates a level shift circuit that includes the capacitive element Csig and P-channel transistors T6 and T7 and shifts an output voltage of the transfer gate TF.

Figure 4:
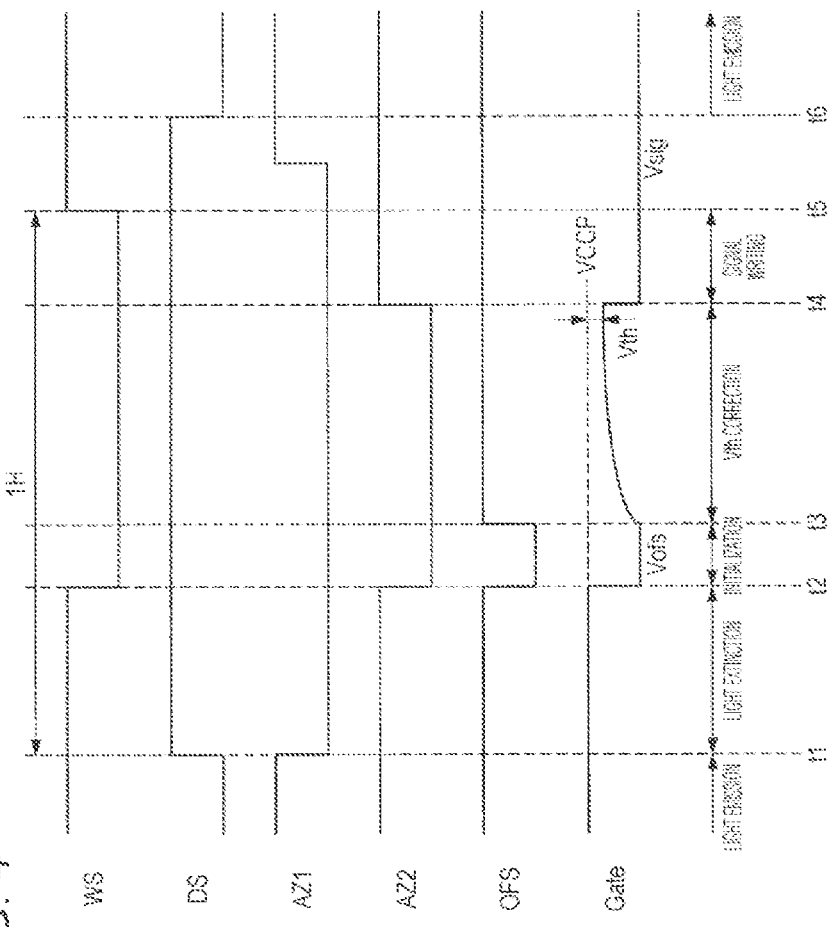
FIG. 4 is an explanatory view illustrating an example of driving the pixel circuit illustrated in FIG. 3.

FIG. 4 is an explanatory diagram illustrating an example of driving the pixel circuit illustrated in FIG. 3. At a time point t1 illustrated in FIG. 4, a light-emission period of the previous frame ends, and a signal line DS is switched from low to high. As a result, the transistor T1 is turned off. Furthermore, at the time point t1, the signal line AZ1 is switched from high to low. As a result, the transistor T4 is turned on, and the potential of the anode of the organic EL element EL is set to Vss.

Thereafter, at a time point t2, a light-extinction period ends, and an initialization period starts. At the time point t2, the signal line WS is switched from high to low, and the transistor T3 is turned on. Furthermore, at the time point t2, the signal line AZ2 is switched from high to low, and the transistor T5 is turned on. Moreover, a signal line OFS is switched from high to low, and the transistor T6 is turned on. Therefore, the gate potential of the transistor T2 is set to Vofs.

Thereafter, at a time point t3, the initialization period ends, and a Vth correction period starts. At the time point t3, the signal line OFS is switched from low to high, and the transistor T6 is turned off. Then, the gate potential of the transistor T2 gradually rises from Vofs. The gate potential of the transistor T2 rises until the potential difference with a power supply voltage VCCP reaches a threshold voltage Vth of the transistor T2.

Thereafter, at a time point t4, the Vth correction period ends, and a signal writing period starts. At the time point t4, the signal line AZ2 is switched from low to high, and the transistor T5 is turned off. Therefore, the gate and the drain of the transistor T2 are short-circuited. As a result, the gate potential of the transistor T2 becomes the potential of the video signal Vsig.

Thereafter, at a time point t5, the signal writing period ends, the signal line WS is switched from low to high, and the transistor T3 is turned off. Thereafter, if the signal line AZ1 is switched from low to high, the transistor T4 is turned off. Then, at a time point t6, the signal line DS is switched from high to low. As a result, the transistor T1 is turned on, a current corresponding to the video signal Vsig flows through the organic EL element EL, and the organic EL element EL emits light according to the amount of the current.

In this pixel circuit, Vth correction operation is performed while the signal line WS is switched to low and the transistor T3 is turned on; however, the voltage of the Vth correction is written not only to the capacitance Cs but also to the signal-line parasitic capacitance Cp and the capacitance Csig. Here, the capacitance Cp has a capacitance value for one signal line and is very large, and the capacitance value of the capacitance Csig is also large due to being written to a signal line having the capacitance Cp. Therefore, it takes time until the gate potential of the transistor T2 converges to VCCP-Vth, which is an obstacle to speeding up driving.

Figure 5:
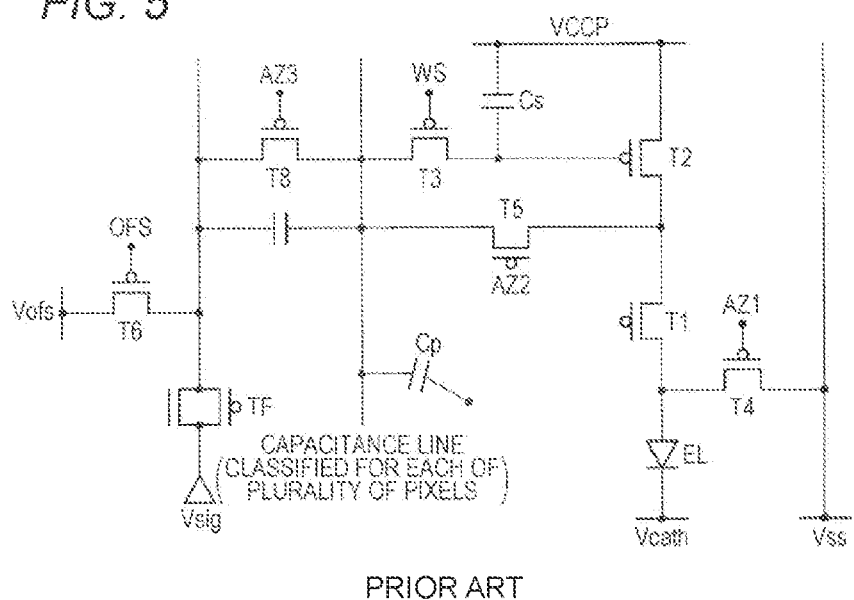
FIG. 5 is an explanatory diagram illustrating a configuration example of a pixel circuit serving as a comparative example.

Therefore, there is also a method in which in order to speed up driving of the pixel circuit, the signal line itself is not used for Vth correction, a capacitance line for correction is separately provided, and the capacitance is reduced by dividing the capacitance line into a plurality of pixels to increase correction speed. FIG. 5 is an explanatory diagram illustrating a configuration example of the pixel circuit serving as a comparative example. The pixel circuit illustrated in FIG. 5 includes P-channel transistors T1 to T5 and T8, an organic EL element EL, and capacitive elements Cs and Cl.

In the pixel circuit illustrated in FIG. 5, a capacitance line for Vth correction is provided between a signal line for supplying a video signal Vsig and the transistor T3, as compared with the pixel circuit illustrated in FIG. 3. The capacitive element Cl is provided between a capacitance line for Vth correction and a signal line for supplying a video signal Vsig. Since the threshold voltage of the transistor T2 is corrected by using charges stored in the capacitive element Cl, the capacitance of capacitances Cp and Csig can be reduced, and the time until the gate potential of the transistor T2 converges to VCCP-Vth is reduced. However, in contrast, the number of transistors in the pixel circuit illustrated in FIG. 5 is greater by one than that in the pixel circuit illustrated in FIG. 3. An increase in the number of transistors leads to an increase in circuit area, which hinders miniaturization of a display.

Accordingly, in view of the above, the disclosing party of the present case has intensively studied a technology capable of speeding up driving without increasing the number of transistors in a pixel circuit including five transistors. As a result, as described below, the disclosing party of the present case has devised a technology capable of speeding up driving without increasing the number of transistors in a pixel circuit including five transistors.

Pixel Circuit According to Embodiment of Present Disclosure

Figure 6:
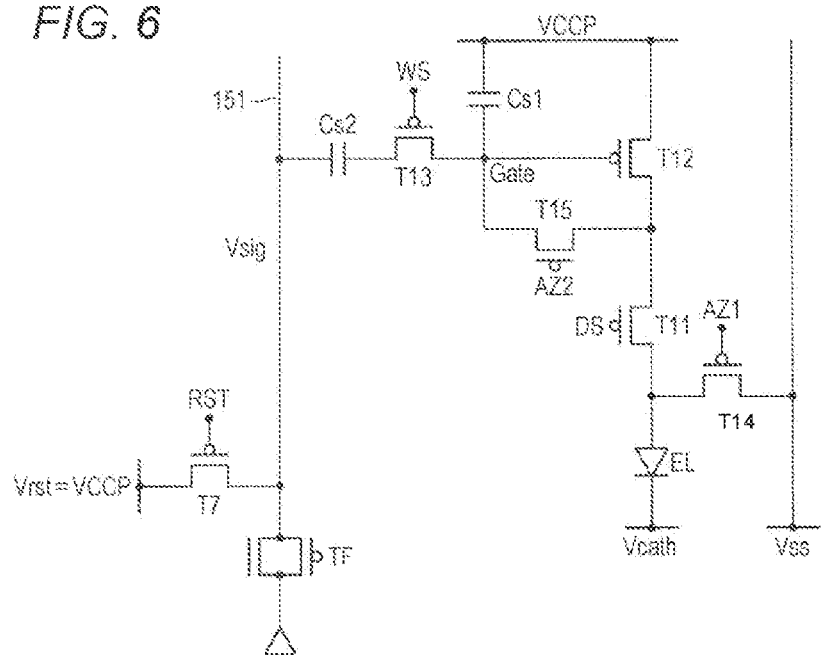
FIG. 6 is an explanatory diagram illustrating a configuration example of a pixel circuit according to the embodiment.

FIG. 6 is an explanatory diagram illustrating an example of a pixel circuit according to an embodiment of the present disclosure. As illustrated in FIG. 6, the pixel circuit according to an embodiment of the present disclosure includes P-channel transistors T11 to T15, an organic EL element EL, and capacitive elements Cs1 and Cs2. Furthermore, a transfer gate TF is provided on a signal line that supplies a video signal Vsig to the pixel circuit.

The transistor T11 functions as a light-emission control transistor, has a gate connected to a signal line DS, a drain connected to an anode of the organic EL element EL, and a source connected to the drain of the transistor T12. The transistor T12 is a drive transistor. A video signal Vsig is supplied to the gate of the transistor T12 via the transistor T13, and the source of the transistor T12 is connected to a power supply voltage VCCP. The transistor T13 is a write transistor. The gate of the transistor T13 is connected to a signal line WS. Furthermore, the capacitive element Cs2 is provided between the source of the transistor T13 and a signal line 151 that supplies the video signal Vsig. The transistors T14 and T15 are reset transistors. The gate of the transistor T14 is connected to a signal line AZ1. The gate of the transistor T15 is connected to a signal line AZ2.

In addition, in the pixel circuit according to the embodiment of the present disclosure, the capacitive element Cs2 is provided between the signal line 151 and the transistor T13. Since the pixel circuit according to the embodiment of the present disclosure includes the capacitive element Cs2, correction of the threshold voltage of the transistor T12, which is a drive transistor, can be sped up.

FIG. 7 is an explanatory diagram illustrating an example of driving the pixel circuit illustrated in FIG. 6. The pixel circuit according to the present embodiment sets a signal RST low once during a light-emission period, turns on a transistor T7, and resets a signal line voltage to Vrst=VCCP. Thereafter, during the light-emission period, the signal RST is set to high again to turn off the transistor T7. Therefore, the voltage of the video signal Vsig becomes Vrst=VCCP after the transistor T7 is turned on. Note that Vrst does not necessarily need to be at the same potential as the power supply voltage VCCP.

Thereafter, at a time point t1, the light-emission period of the previous frame ends, and a signal line DS is switched from low to high. As a result, the transistor T11 is turned off. Furthermore, at the time point t1, the signal line AZ1 is switched from high to low. As a result, the transistor T14 is turned on, and the potential of the anode of the organic EL element EL is set to Vss.

Thereafter, at a time point t2, a light-extinction period ends, and an initialization period starts. At the time point t2, the signal line WS is switched from high to low, and the transistor T13 is turned on. Furthermore, at the time point t2, the signal line DS is switched from high to low, and the transistor T11 is turned on. Furthermore, at the time point t2, the signal line AZ2 is switched from high to low, and the transistor T15 is turned on. Therefore, the gate voltage of the transistor T12 is lowered from VCCP, and a preparation voltage for Vth correction is written to the gate of the transistor T12.

Here, assuming that the low voltage of each of the signal lines AZ1, AZ2, and DS is V_Low, and the threshold voltages of the transistors T14, T15, and T11 are Vth (AZ1)=Vth (AZ2)=Vth (DS)=Vth, the voltage Vg written to the gate of the transistor T12 at the time point t2 is Vg=|Vth|+V_low if Vss<|Vth|+V_low, and Vg=Vss if Vss≥|Vth|+V_low. In any case, it is necessary to set the voltage such that the transistor T12 is turned on.

Thereafter, at a time point t3, the initialization period ends, and a Vth correction period starts. At the time point t3, the signal line DS is switched from low to high, and the transistor T11 is turned off. Then, the gate potential of the transistor T12 gradually rises from Vg. The gate potential of the transistor T12 increases until the potential difference with a power supply voltage VCCP reaches the threshold voltage Vth of the transistor T12. The effect of providing the capacitive element Cs2 is that the Vth correction period can be shortened.

Thereafter, at a time point t4, the Vth correction period ends, and a signal writing period starts. At the time point t4, the signal line AZ2 is switched from low to high, and the transistor T15 is turned off. Therefore, the gate and the drain of the transistor T12 are short-circuited. At this time point, the voltage of the video signal Vsig transitions from VCCP to VCCP−Vdata. Then, since the transistor T13 is turned on, the gate voltage of the transistor T12 becomes VCCP−Vth−Vdata*Cs2/(Cs1+Cs2). That is, the gate voltage of the transistor T12 becomes a voltage reflecting the threshold voltage Vth, and the threshold voltage Vth of the transistor T12 is canceled upon light emission.

Thereafter, at a time point t5, the signal writing period ends, the signal line WS is switched from low to high, and the transistor T13 is turned off. Thereafter, if the signal line AZ1 is switched from low to high, the transistor T14 is turned off. Then, at a time point t6, the signal line DS is switched from high to low. As a result, the transistor T11 is turned on, a current corresponding to the video signal Vsig flows through the organic EL element EL, and the organic EL element EL emits light according to the amount of the current.

The pixel circuit according to the embodiment of the present disclosure has a configuration as illustrated in FIG. 6 and is driven as illustrated in FIG. 7. As a result, in the pixel circuit including five transistors, it is possible to speed up the driving without increasing the number of transistors. That is, in the above-described comparative examples, it is necessary to charge the signal line when the threshold voltage of the drive transistor is corrected, which hinders high-speed driving. In contrast, since the pixel circuit according to the embodiment of the present disclosure includes the capacitive element Cs2 appropriately for each pixel, it is possible to correct the threshold voltage of the drive transistor at high speed.

Furthermore, the pixel circuit illustrated in FIG. 6 includes power supplies fewer by one than that in the comparative example illustrated in FIG. 3. That is, the pixel circuit according to the embodiment of the present disclosure illustrated in FIG. 6 can reduce the number of the power supplies required for driving the circuit by sharing the Vth correction preparation voltage with a light-extinction reset power supply Vss.

2. Summary

As described above, according to the embodiment of the present disclosure, the pixel circuit including five transistors is provided. In the pixel circuit, it is possible to speed up driving without increasing the number of transistors.

Then, a display device including the pixel circuit according to the embodiments of the present disclosure and an electronic apparatus including such a display device are also provided. Examples of such an electronic apparatus include a television, a mobile phone such as a smartphone, a tablet-type mobile terminal, a personal computer, a mobile game console, a mobile music player, a digital still camera, a digital video camera, a wristwatch-type mobile terminal, a wearable device, and the like.

While the preferred embodiments of the present disclosure have been described in detail with reference to the accompanying drawings, the technical scope of the present disclosure is not limited to such examples. It is obvious that a person skilled in the art of the present disclosure can conceive various modifications and corrections within the scope of the technical idea described in the claims, and it is naturally understood that these modifications and corrections also belong to the technical scope of the present disclosure.

Furthermore, the effects described in the present Description are illustrative or exemplary only and are not limited. That is, the technology according to the present disclosure can exhibit other effects that are apparent to those skilled in the art from the description of the present Description in addition to or in lieu of the effects described above.

Note that the following configurations also belong to the technical scope of the present disclosure.

(1)

A pixel circuit including a light-emitting element, a drive transistor configured to supply a current to the light-emitting element, a light-emission control transistor configured to control connection between a drain node of the drive transistor and an anode of the light-emitting element, a first reset transistor configured to set a potential of the anode of the light-emitting element to a predetermined potential, a second reset transistor configured to control connection between the drain node of the drive transistor and a gate node of the drive transistor, a write transistor configured to control writing of a signal voltage at the gate node of the drive transistor, a first capacitive element provided between the gate node of the drive transistor and a power supply line, and a second capacitive element provided between a signal line to which the signal voltage is applied and a source node of the write transistor.

(2)

The pixel circuit according to the (1), in which a preparation voltage set upon correction of a threshold voltage of the drive transistor is a value obtained by adding a potential on a low side to a threshold voltage of the first reset transistor in a case where the predetermined potential is less than a value obtained by adding the low-side potential to the threshold voltage of the first reset transistor, and the preparation voltage is equal to the predetermined potential in a case where the predetermined potential is equal to or higher than a value obtained by adding the potential on the low-side to the threshold voltage of the first reset transistor.

(3)

A display device including the pixel circuit according to the (1) or (2).

(4)

An electronic apparatus including the display device according to the (3).

(5)

A driving method of a pixel circuit including a light-emitting element, a drive transistor configured to supply a current to the light-emitting element, a light-emission control transistor configured to control connection between a drain node of the drive transistor and an anode of the light-emitting element, a first reset transistor configured to set a potential of the anode of the light-emitting element to a predetermined potential, a second reset transistor configured to control connection between the drain node of the drive transistor and a gate node of the drive transistor, a write transistor configured to control writing of a signal voltage at a gate node of the drive transistor, a first capacitive element provided between the gate node of the drive transistor and a power supply line, and a second capacitive element provided between a signal line to which the signal voltage is applied and a source node of the write transistor, the method including:

turning off the light-emission control transistor and turning on the first reset transistor to set the potential of the anode of the light-emitting element to the predetermined potential upon start of a first period;

turning on the write transistor and the light-emission control transistor and turning on the second reset transistor to set a potential of the gate node of the drive transistor to a preparation voltage upon start of a second period after the first period;

turning off the light-emission control transistor to correct a threshold voltage of the drive transistor upon start of a third period after the second period;

turning on the second reset transistor upon start of a fourth period after the third period;

turning off the write transistor upon start of a fifth period after the fourth period;

turning off the first reset transistor during the fifth period; and turning on the light-emission control transistor to supply a current to the light-emitting element upon start of a sixth period after the fifth period.

(6)

The driving method of the pixel circuit according to the (5) in which the preparation voltage in the second period is a value obtained by adding a potential on a low side to a threshold voltage of the first reset transistor in a case where the predetermined potential is less than a value obtained by adding the potential on the low side to the threshold voltage of the first reset transistor, and the preparation voltage is equal to the predetermined potential in a case where the predetermined potential is equal to or higher than a value obtained by adding the potential on the low side to the threshold voltage of the first reset transistor.

REFERENCE SIGNS LIST

100 Display device
110 Pixel unit
111B Pixel
111G Pixel
111R Pixel
120 Horizontal selector
130 Vertical scanner
131 Auto zero scanner
132 Drive scanner
133 Write scanner
151 Signal line
Cs1 Capacitive element
Cs2 Capacitive element
T1 Transistor
T11 Transistor
T12 Transistor
T13 Transistor
T14 Transistor
T15 Transistor

The invention claimed is:

1. A pixel circuit, comprising:
a light-emitting element;
a drive transistor configured to supply a current to the light-emitting element;
a light-emission control transistor configured to control connection between a drain node of the drive transistor and an anode of the light-emitting element;
a first reset transistor configured to set a potential of the anode of the light-emitting element to a specific potential;
a second reset transistor configured to control connection between the drain node of the drive transistor and a gate node of the drive transistor;
a write transistor configured to control writing of a signal voltage at the gate node of the drive transistor, wherein
a first terminal of the second reset transistor is connected between the gate node of the drive transistor and a drain node of the write transistor, and
a second terminal of the second reset transistor is connected to the drain node of the drive transistor;
a first capacitive element between the gate node of the drive transistor and a power supply line; and
a second capacitive element between a signal line to which the signal voltage is applied and a source node of the write transistor, wherein the second capacitive element is configured to:
reduce a time associated with correction of a threshold voltage of the drive transistor, wherein the threshold voltage of the drive transistor is equal to one of the specific potential or a value obtained by addition of a potential on a low side to a threshold voltage of the first reset transistor; and
set a preparation voltage based on the correction of the threshold voltage of the drive transistor.

2. The pixel circuit according to claim 1, wherein
the preparation voltage is equal to the value in a case where the specific potential is less than the value, and
the preparation voltage is equal to the specific potential in a case where the specific potential is equal to or greater than the value.

3. A display device, comprising:
a pixel circuit that includes:
a light-emitting element;
a drive transistor configured to supply a current to the light-emitting element;
a light-emission control transistor configured to control connection between a drain node of the drive transistor and an anode of the light-emitting element;
a first reset transistor configured to set a potential of the anode of the light-emitting element to a specific potential;
a second reset transistor configured to control connection between the drain node of the drive transistor and a gate node of the drive transistor;

a write transistor configured to control writing of a signal voltage at the gate node of the drive transistor, wherein
  a first terminal of the second reset transistor is connected between the gate node of the drive transistor and a drain node of the write transistor, and
  a second terminal of the second reset transistor is connected to the drain node of the drive transistor;
a first capacitive element between the gate node of the drive transistor and a power supply line; and
a second capacitive element between a signal line to which the signal voltage is applied and a source node of the write transistor, wherein the second capacitive element is configured to:
  reduce a time associated with correction of a threshold voltage of the drive transistor, wherein the threshold voltage of the drive transistor is equal to one of the specific potential or a value obtained by addition of a potential on a low side to a threshold voltage of the first reset transistor; and
  set a preparation voltage based on the correction of the threshold voltage of the drive transistor.

4. An electronic apparatus, comprising:
a display device that includes a pixel circuit, wherein the pixel circuit includes:
a light-emitting element;
a drive transistor configured to supply a current to the light-emitting element;
a light-emission control transistor configured to control connection between a drain node of the drive transistor and an anode of the light-emitting element;
a first reset transistor configured to set a potential of the anode of the light-emitting element to a specific potential;
a second reset transistor configured to control connection between the drain node of the drive transistor and a gate node of the drive transistor;
a write transistor configured to control writing of a signal voltage at the gate node of the drive transistor, wherein
  a first terminal of the second reset transistor is connected between the gate node of the drive transistor and a drain node of the write transistor, and
  a second terminal of the second reset transistor is connected to the drain node of the drive transistor;
a first capacitive element between the gate node of the drive transistor and a power supply line; and
a second capacitive element between a signal line to which the signal voltage is applied and a source node of the write transistor, wherein the second capacitive element is configured to:
  reduce a time associated with correction of a threshold voltage of the drive transistor, wherein the threshold voltage of the drive transistor is equal to one of the specific potential or a value obtained by addition of a potential on a low side to a threshold voltage of the first reset transistor; and
  set a preparation voltage based on the correction of the threshold voltage of the drive transistor.

5. A driving method, comprising:
in a pixel circuit including
  a light-emitting element,
  a drive transistor configured to supply a current to the light-emitting element,
  a light-emission control transistor configured to control connection between a drain node of the drive transistor and an anode of the light-emitting element,
  a first reset transistor configured to set a potential of the anode of the light-emitting element to a specific potential,
  a second reset transistor configured to control connection between the drain node of the drive transistor and a gate node of the drive transistor,
  a write transistor configured to control writing of a signal voltage at the gate node of the drive transistor, wherein
    a first terminal of the second reset transistor is connected between the gate node of the drive transistor and a drain node of the write transistor, and
    a second terminal of the second reset transistor is connected to the drain node of the drive transistor,
  a first capacitive element between the gate node of the drive transistor and a power supply line, and
  a second capacitive element between a signal line to which the signal voltage is applied and a source node of the write transistor:
    turning off the light-emission control transistor and turning on the first reset transistor to set the potential of the anode of the light-emitting element to the specific potential upon start of a first period;
    turning on the write transistor and the light-emission control transistor and turning on the second reset transistor to set a potential of the gate node of the drive transistor to a preparation voltage upon start of a second period after the first period;
    turning off the light-emission control transistor to correct a threshold voltage of the drive transistor upon start of a third period after the second period;
    turning on the second reset transistor upon start of a fourth period after the third period;
    turning off the write transistor upon start of a fifth period after the fourth period;
    turning off the first reset transistor during the fifth period; and
    turning on the light-emission control transistor to supply the current to the light-emitting element upon start of a sixth period after the fifth period.

6. The driving method according to claim 5, wherein
the preparation voltage in the second period is equal to one of the specific potential or a value obtained by adding a potential on a low side to a threshold voltage of the first reset transistor,
the preparation voltage is equal to the value in a case where the specific potential is less than the value, and
the preparation voltage is equal to the specific potential in a case where the specific potential is equal to or greater than the value.

* * * * *